United States Patent [19]
Heckaman et al.

[11] Patent Number: 5,124,677
[45] Date of Patent: Jun. 23, 1992

[54] WAFFLELINE-CONFIGURED SURFACE-MOUNT PACKAGE FOR HIGH FREQUENCY SIGNAL COUPLING APPLICATIONS

[75] Inventors: Douglas Heckaman, Indialantic; Diane G. Caruso, Palm Bay, both of Fla.

[73] Assignee: Harris Corporation, Melbourne, Fla.

[21] Appl. No.: 571,082

[22] Filed: Aug. 22, 1990

[51] Int. Cl.⁵ .............................................. H01P 3/00
[52] U.S. Cl. .................................... 333/236; 333/245; 361/395
[58] Field of Search ............................ 333/1, 245-247, 333/116, 236; 361/392-395, 397, 399, 401; 174/52.1-52.5

[56] References Cited

U.S. PATENT DOCUMENTS

| | | |
|---|---|---|
| 4,549,200 | 10/1985 | Ecker et al. ................ 361/395 X |
| 4,695,810 | 9/1987 | Heckaman et al. ............. 333/1 |
| 4,768,004 | 8/1988 | Wilson ...................... 333/247 X |
| 4,851,793 | 7/1989 | Heckaman et al. ............. 333/1 |

Primary Examiner—Eugene R. LaRoche
Assistant Examiner—Seung Ham
Attorney, Agent, or Firm—Evenson, Wands, Edwards, Lenahan & McKeown

[57] ABSTRACT

A waffleline-configured, surface-mount transmission line module contains a two-dimensional arrangement of periodically distributed conductive surface mesas and channels. Within the channels are segments of dielectrically surrounded conductor. The geometry of the arrangement of segments among the waffleline channels is defined in accordance with the intended signal coupling functionality of the interconnect structure. For example, in the case of a signal splitting application, the conductor segments may be arranged in a tree-like configuration between an input port and multiple output ports. Isolation resistors may be disposed within the channels of the waffleline between adjacent locations of diverging conductor runs among the mesas of the waffleline. The resulting transmission line module is then surface-mounted on the same printed wiring board as the signal processing components it is to interconnect, and respective portions of the segments of dielectrically surrounded conductor within the channels of the waffleline module are connected to signal ports of adjacent signal processing components. Because each waffleline interconnect module is relatively thin, multiple modules may be mounted in a stacked configuration on the printed wiring board to realize a three-dimensional waffleline module structure, with intermodule vias and interconnects provided between selected locations of conductor segments of adjacent layers.

26 Claims, 8 Drawing Sheets

WAFFLELINE-CONFIGURED SURFACE-MOUNT PACKAGE FOR HIGH FREQUENCY SIGNAL COUPLING APPLICATIONS

FIELD OF THE INVENTION

The present invention relates in general to communication systems and is particularly directed to a method of implementing coupling functions for high frequency signals including, but not limited to, microwaves, millimeter waves, digital signals and UHF band frequencies. Applications in which the coupling functions of the invention may be employed include digital signal processing functions, delay lines, power splitters, low pass filtering, transformers and custom networks. The coupling functions are implemented in the form of a waffleline-configured surface-mount package, so as to enable transmission line interconnect functions to be compactly integrated 'on-board' with other surface-mount signal processing devices they are to interconnect.

BACKGROUND OF THE INVENTION

Continuing improvements in semiconductor processing technology for high frequency signal processing applications has made it possible to achieve a considerable reduction in the size of microminiaturized communication circuit components. This is particularly true where the signal processing components are physically packaged using surface-mount technologies, permitting a plurality of modules to be compactly nested in closed proximity of one another on a support board. However, a communication system consists of more than just an arrangement of signal processing devices; it also contains signal transmission links through which the devices are interconnected. As bandwidths for such components have increased well into the double digit Giga-Hertz range, the physical occupation area of the signal processing devices is often smaller than that of the transmission line interconnects. Moreover, since the support board, upon which the circuit device packages are surface-mounted, is typically made of a relatively lossy material (e.g. G-10 dielectric), the transmission line interconnect structure may suffer substantial attenuation, in addition to the large surface occupation area penalty it places on the packaging scheme.

To reduce the attenuation problem, the signal coupling lines may be mounted on a separate low-loss dielectric, such as a sheet of Teflon. Although the use of such a separate, low loss transmission line support structure may help reduce interconnect loss, it necessarily will increase the size of the overall packaging scheme. Unfortunately, in either approach, isolation between adjacent segments of interconnect remains relatively poor.

SUMMARY OF THE INVENTION

In accordance with the present invention, we have developed a transmission line packaging scheme that enables high frequency signal coupling functions to be integrated on the same surface-mount support structure as the signal processing components they interconnect, thereby not only enhancing package integrator density, but improving the signal processing performance of the overall communication circuitry architecture. For this purpose, the present invention comprises a waffleline-configured, conductive structure formed of a two-dimensional arrangement of periodically distributed conductive surface mesas, the mesas being spaced-apart from one another by a two-dimensional arrangement of intersecting channels. In order to form a compact transmission line-containing surface-mount module, dielectrically surrounded conductor segments (e.g. quarter wavelength conductor segments) are disposed within channels of the waffleline-configured conductive structure. The geometry of the arrangement of conductor segments among the waffleline channels is defined in accordance with the intended signal coupling functionality of the interconnect structure. For example, in the case of a signal splitting application, the conductor segments may be arranged in a tree-like configuration between an input port and multiple output ports. Isolation resistors may be disposed within the channels of the waffleline between adjacent locations of diverging conductor runs among the mesas of the waffleline. Because of the two-dimensional periodicity of the waffleline channel/mesa structure, the characteristic impedance of each conductor segment remains substantially constant regardless of changes in direction of its layout among the mesas of the module. The resulting transmission line module is then surface-mounted on the same printed wiring board as the signal processing components it is to interconnect, and respective portions of the segments of dielectrically surrounded conductor within the channels of the waffleline module are connected to signal ports of adjacent signal processing components.

Because each waffleline interconnect module is relatively thin, multiple modules may be mounted in a stacked configuration on the printed wiring board to realize a three-dimensional waffleline module structure, with intermodule vias and interconnects provided between selected locations of conductor segments of adjacent layers. To provide a conductive shield (ground plane) for the interconnect arrangements, a respective conductive cover is attached to each module, such that the cover is mounted on the tops of the mesas, whereby the segments of dielectrically surrounded conductor that are disposed in the waffleline channels are surrounded by the conductive material of the waffleline-configured conductive structure and the conductive cover.

Surface-mounting of the stacked package to the printed wiring board may be accomplished by providing the conductive cover with a plurality of tabs that project from the sides of the module and conductively adhering one or more of the tabs to metallized pads of the printed wiring board.

In addition to the foregoing above embodiments in which the waffleline module is surface-mounted on the top surface of a printed wiring board, with signal conductor projections extending to transmission line pads and cover tabs being affixed to ground-plane land regions on the surface of the board, the present invention readily lends itself to cavity-mount architectures formed of one or more tiered layers of support board and interconnect Namely, where a multilayer signal processing device support structure contains a plurality of stripline-supporting printed wiring board layers, that are accessible by way of a cavity, the waffleline surface-mount module of the present invention may be inserted into the cavity to provide a transmission line device through which signals present on respective layers of the printed wiring board may be distributed to other printed wiring board layers.

DETAILED DESCRIPTION

As pointed out briefly above, the present invention is directed to a transmission line packaging scheme that enables signal coupling applications for high frequency signals, such as microwaves, millimeter waves, digital signals and UHF band frequencies, to be implemented in the form of a 'waffleline-configured' module that is capable of being installed on the same support structure that carries surface-mounted signal processing components. The phrase 'waffleline-configured' is intended to refer to a transmission line medium in the form of a two-dimensional periodic structure of conductive channels and mesas though which insulated wire is laid. In particular, a preferred form of such a transmission line medium is described in detail in U.S. Pat. No. 4,851,793 entitled "Waffleline-Configured Transmission Link" by D. E. Heckaman et al, issued Jul. 25, 1989, assigned to the assignee of the present application and the disclosure of which is incorporated herein.

Figure 1:
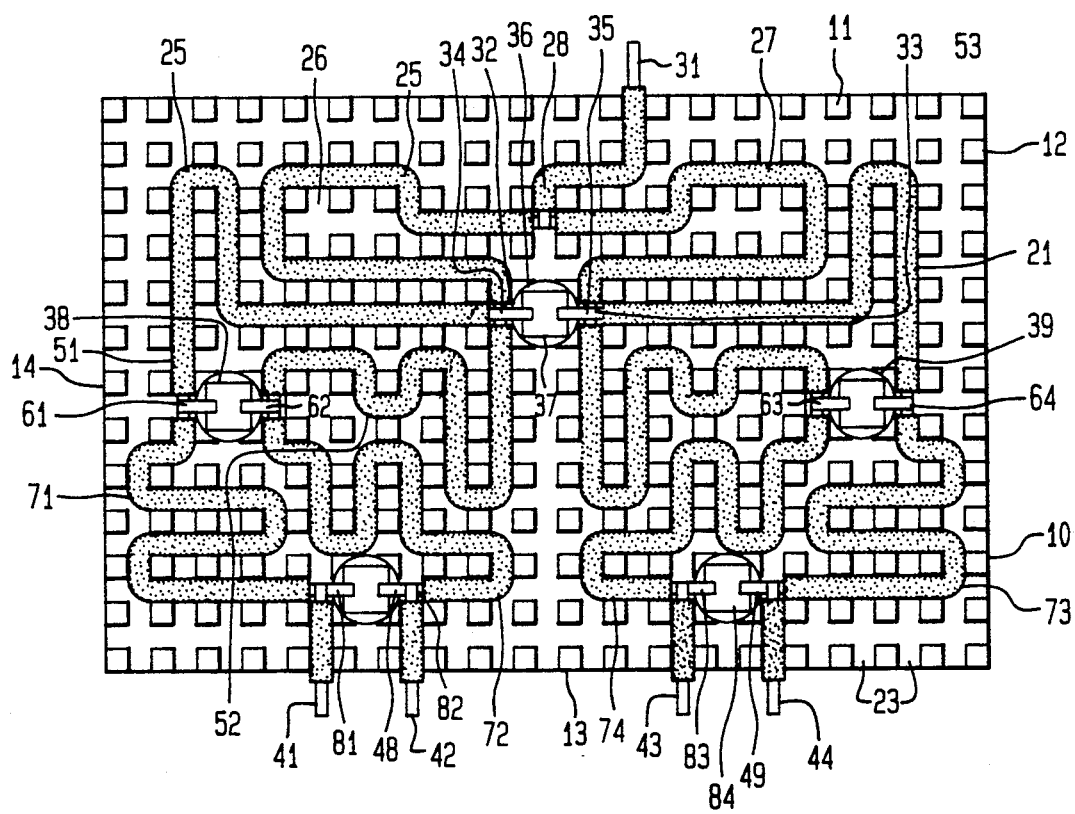
FIG. 1 is a plan view of a waffleline-configured surface-mount package containing a 1:4 power divider.

The manner in which such a waffleline structure may be used in accordance with the principles of the present invention to 'modularize' one or more transmission line components as a surface-mountable package is diagrammatically illustrated in FIG. 1, which is a top or plan view of a waffleline-configured surface-mount package 10 containing a 1:4 power divider or splitter. Surface-mount package 10 is preferably formed of a rectangularly or square-shaped segment of conductive waffleline plate having respective side edges 11, 12, 13 and 14, so that, when mounted on a support structure, its side edges may be closely juxtaposed with those of other surface-mount packages that are similarly shaped, thereby facilitating transmission line interconnections among multiple surface-mount components. Being made of waffleline plate, package 10 contains a two-dimensional arrangement of periodically distributed conductive surface mesas 21, which are spaced-apart from one another by a two-dimensional arrangement intersecting channels 23, as described in the above-referenced Heckaman et al Patent. For purposes of example, the center-to-center spacings of the mesas (and channels) may be on the order of 50 mils.

In order to implement a 1:4 power divider, segments of dielectrically surrounded conductor 25 (e.g. quarter wavelength, 70 ohm segments) are disposed within channels 23 between an input port 31 at side edge 11 and four respective output ports 41, 42, 43 and 44 at side edge 13 of plate 10. For the above-referenced channel spacing of 50 mils, the wired thickness (total jacketed diameter) of conductor segments 25 may be on the order of 20 mils. The diameter of the center conductor may be on the order of six mils.

As pointed out previously, the geometry of the arrangement of conductor segments 25 among the waffleline channels 23 is defined in accordance with the intended signal coupling functionality of the interconnect structure. For the present example of a signal splitting application, the conductor segments are shown as being arranged in a tree-like configuration between input port 31 and output ports 41, 42, 43 and 44. This tree-like conductor configuration comprises a first pair of meandering (quarter wavelength) conductor segments 26 and 27 extending from a first split point 28, to which input port 31 is connected, to second and third split points 32 and 33, respectively. Respective first and second terminals 34 and 35 of a first isolation resistor element 36 are coupled to transmission line split points 32 and 33. To physically accommodate resistor element 36, a portion of the mesa structure of the waffleline plate is removed, e.g. by boring out the plate to form a cylindrical depression 37. Extending from split points 32 and 33 are second and third pairs of meandering (quarter wavelength) conductor segments 51, 52 and 53, 54, opposite ends of which are connected to respective pairs of isolation resistor connection points 61, 62 and 63, 64, whereat second and third isolation resistor elements 38 and 39 are respectively connected. Extending from connection points 61, 62 and 63, 64 are fourth and fifth pairs of (quarter wavelength) conductor segments 71, 72 and 73, 74, opposite ends of which are connected to respective pairs of additional isolation resistor connection points 81, 82 and 83, 84 whereat fourth and fifth isolation resistor elements 48 and 49 are respectively connected. Output ports 41, 42, 43 and 44 are respectively coupled to connection points 81, 82, 83 and 84, as shown.

As noted above, because of the two-dimensional periodicity of the waffleline channel/mesa structure, the characteristic impedance of each meandering conductor segment remains substantially constant regardless of changes in direction of its layout among the mesas of the module. Thus the path which an individual conductor segment follows among the channels of the waffleline is not constrained to a specific geometry.

Figure 2:
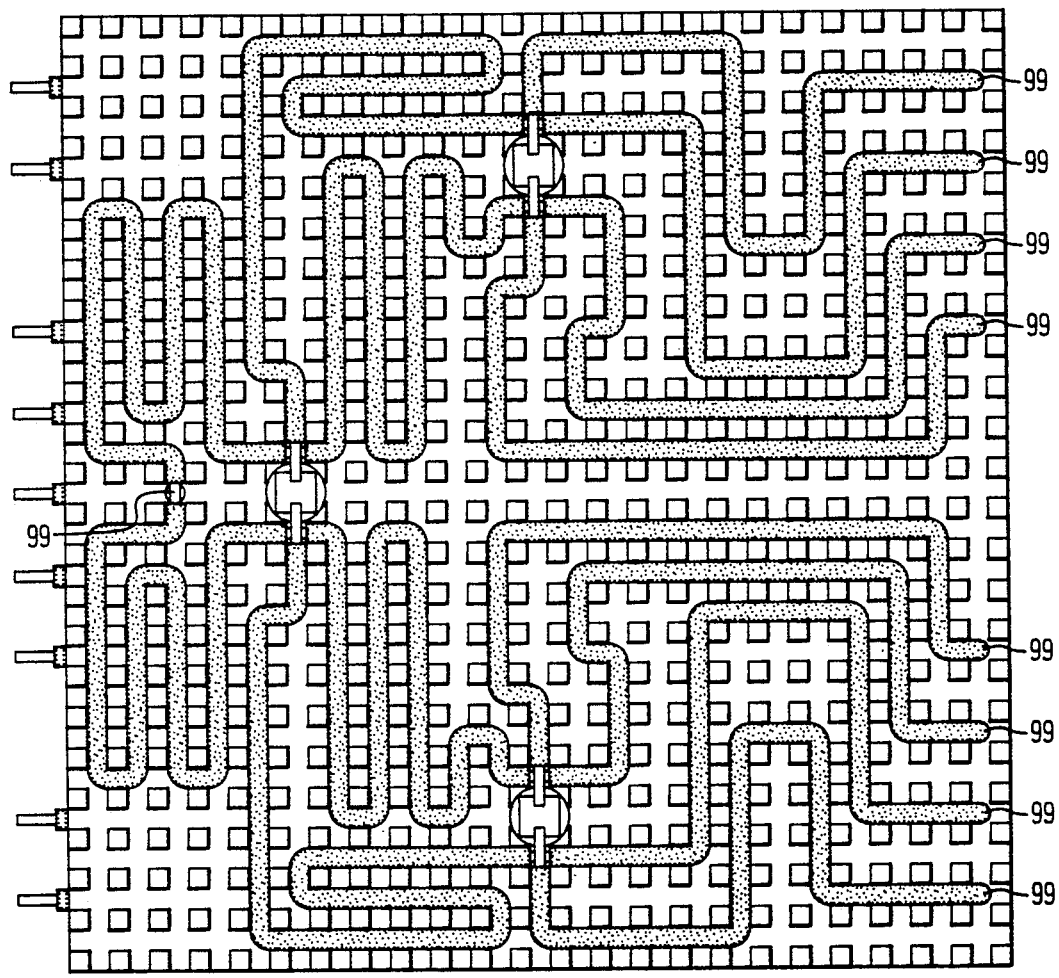
FIGS. 2 and 3 show top and bottom plan views of a waffleline module containing a 1:8 power divider.
Figure 3:
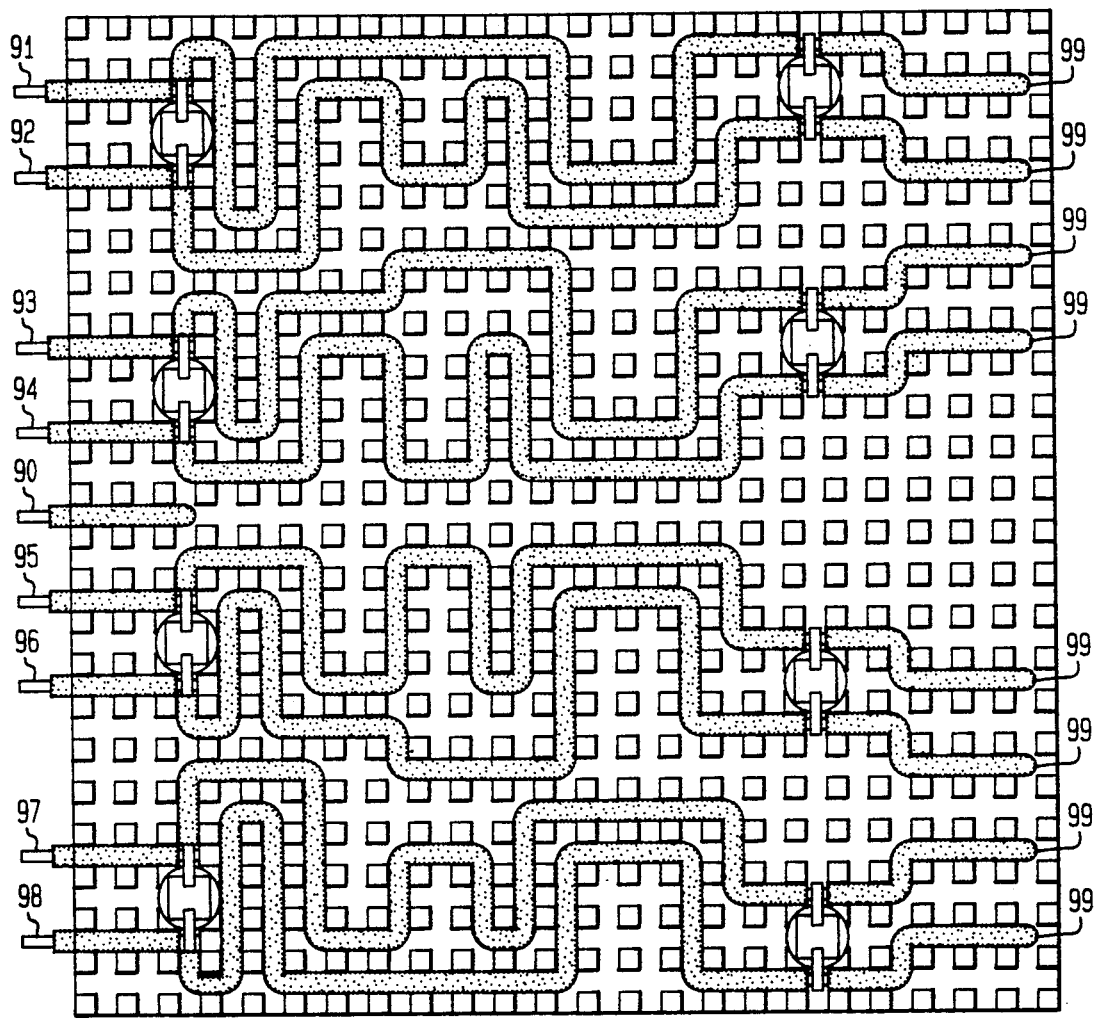

In the foregoing example of a 1:4 power divider, depending upon operating frequency, all of the conductor runs (and associated isolation resistors) may be accommodated on the same side of the waffleline plate, as is the case of such a divider operating over a frequency range of 4-8 GHz. A typical edgewise dimension of the module is on the order of one inch. It should be realized, however, that the present invention is not limited to the use of only a single sided waffleline structure. Depending upon frequency and signal splitting parameters, additional runs of segmented conductor may be provided on the opposite side of the waffleline plate, with vias through the plate affording access for the conductor runs between opposite sides of the plate. For example, in the case of a 1:8 splitter operating over a lower frequency range (e.g. on the order of 2–4 GHz), both sides of the waffleline plate may contain a two-dimensional periodic structure of conductive channels and mesas though which segments of insulated wire are distributed from an input port 90 to a plurality of (eight) output ports 91 . . . 98, distributed along a common side edge of the waffleline structure, as illustrated in FIGS. 2 and 3. In this example, through holes 99 may have a diameter on the order of 25 mils in order to accommodate ninety degree turns in the 20 mil conductor. At the side edge terminations of the input and output ports the dielectrically surrounded conductor is stripped of its surrounding dielectric jacket for electrical and mechanical attachment to a surface-mount interconnect pad on the printing wiring board or to another package. In order to maximize mechanical strength at the port attachment locations, each conductor segment which provides a port connection may be formed of common copper-plated steel core center conductor. In addition, to internally anchor the signal wire within the channel that extends to the location where the wire exits the side edge of the module, non-conductive (microwave application) epoxy may be injected into a portion of the channel adjacent to the side edge.

Figure 4:
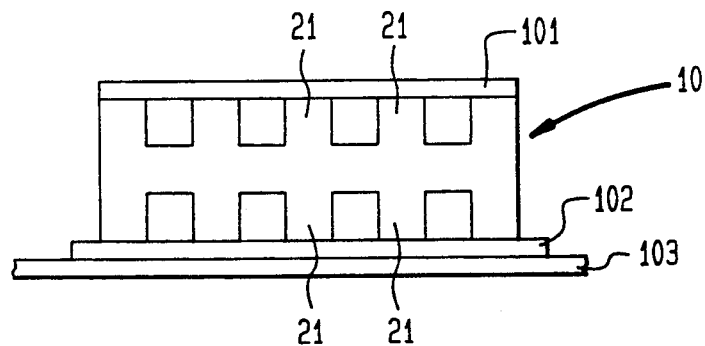
FIG. 4 diagrammatically shows a side view of waffleline module having mesa-channel matrices on both the top and bottom sides of the waffleline plate.

After all internal wiring of the module has been completed, thin (e.g. on the order of 3 mils) metal covers 101 and 102 are bonded atop the mesa structures of each waffleline matrix, so as to provide a minimum thickness shield, as diagrammatically shown in FIG. 4, which is a side view of waffleline module having mesa-channel matrices on both the top and bottom sides of the waffleline plate. Covers 101 and 102 may be bonded to the mesas 21 by spot welding to the tops of the mesas or by applying a high temperature conductive epoxy on the top surface of each mesa. The mesas or covers may also be preliminarily coated or plated with a higher melting temperature solder, such as a eutectic gold-tin solder.

Figure 5:
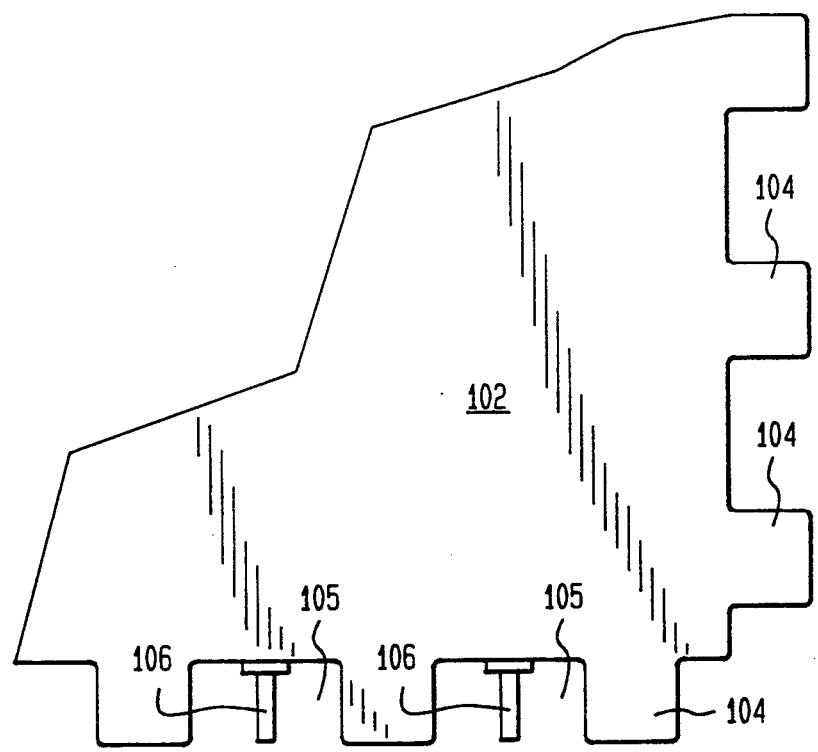
FIG. 5 diagrammatically shows a waffleline module bottom cover provided with a plurality of mounting and grounding tabs.
Figure 6:
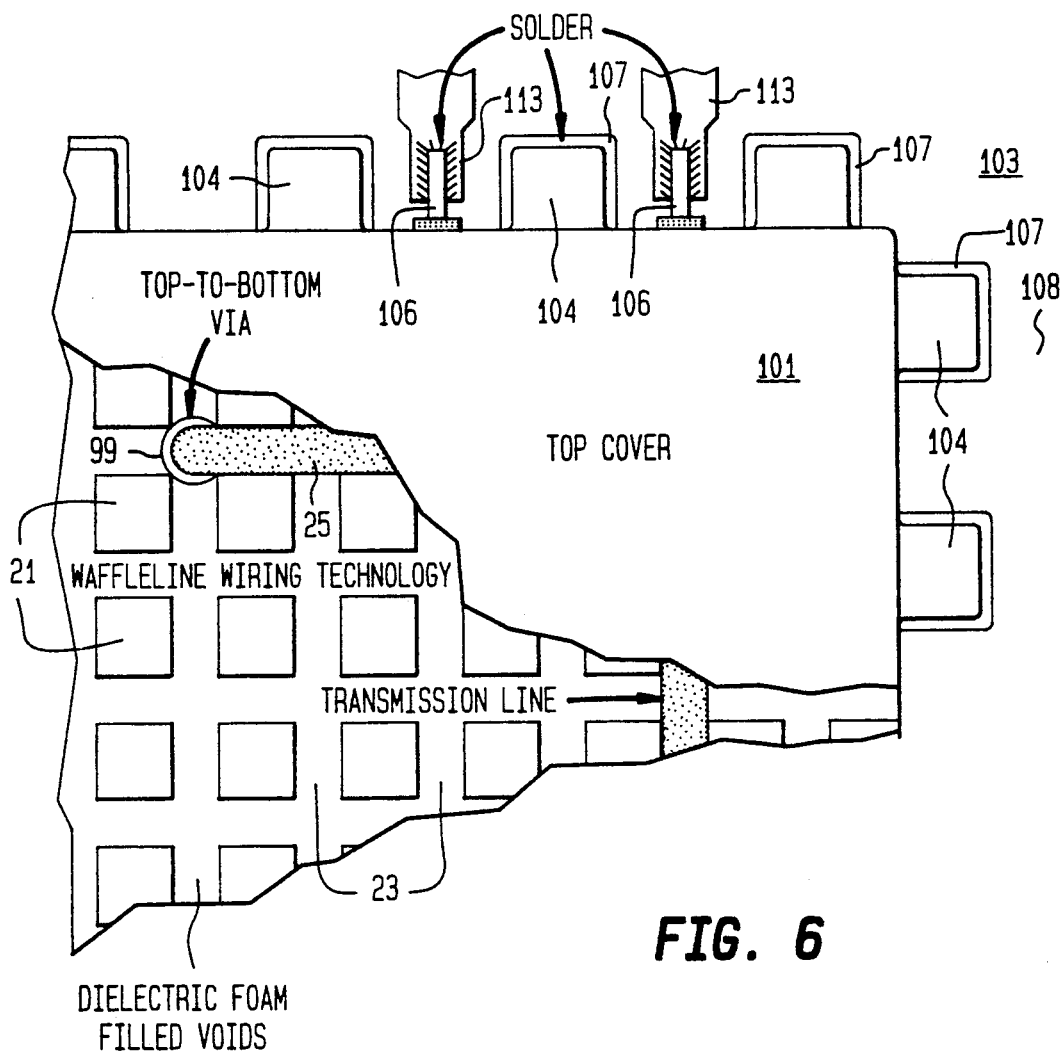
FIG. 6 shows solder attachments to signal pads and grounding tabs on the top side of printed wiring board.

For surface-mount attachment to an underlying printed wiring board 103, bottom cover 102 may be provided with a plurality of mounting and grounding tabs 104 that extend beyond the side edges of the waffleline plate, while providing clearance for access to the projecting signal conductor leads, as diagrammatically shown in FIG. 5. Using the parameters of the present example, the centers of tabs 104 are separated from one another by 100 mil spacings, with channel openings 105 for signal conductor projections 106 intermediate tabs 104, so that tabs 104 and signal conductors 106 are interleaved with one another along the edges of the waffleline module 10 at 50 mil spacings. As shown in FIG. 6, through solder attachment to grounding pads 107 on the top side 108 of printed wiring board 103, tabs 104 provide a secure mechanical and electrical grounding surface-mount of the module. Similarly, projecting signal conductors 106 may be soldered to transmission line tracks 113.

Figure 7:
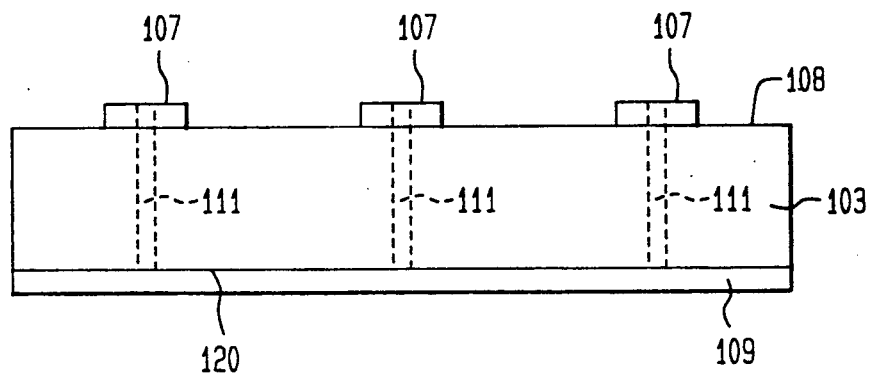
FIG. 7 shows a printed wiring board having a metallized ground plane layer formed on its bottom surface.

As further illustrated in FIG. 7, printed wiring board 103 may have a metallized ground plane layer 109 formed on its bottom surface 120 opposite to the top surface 108 on which the surface-mount modules are supported. In this case, grounding pads 107 may be provided with conductive vias 111 which extend through the board for providing connection to the ground plane layer 109.

Figure 8:
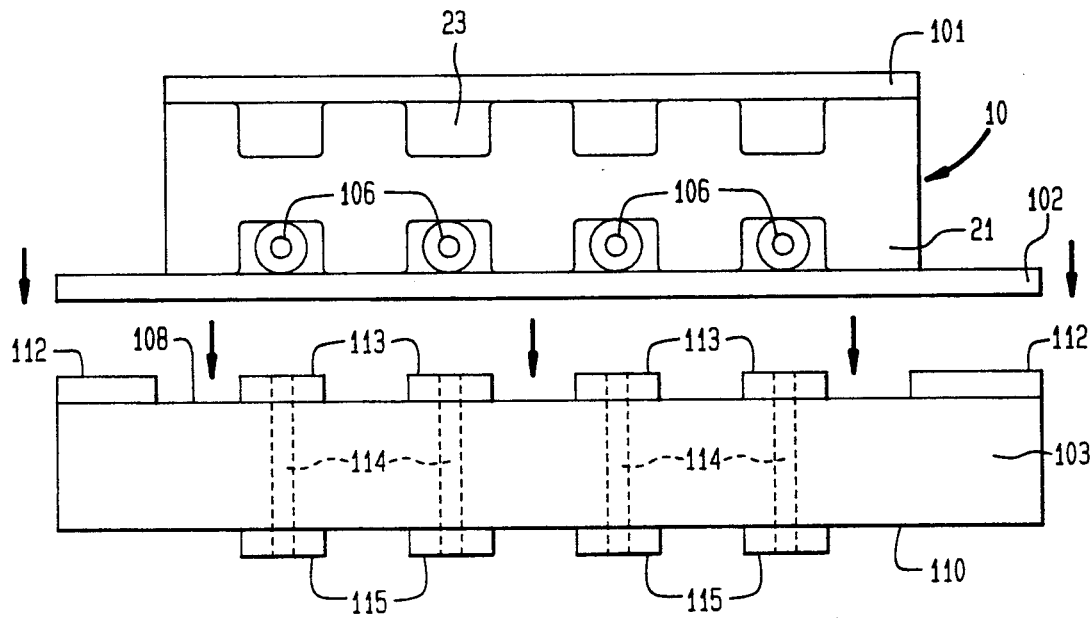
FIG. 8 diagrammatically illustrates a ground plane layer formed on the surface-mount attachment side of a printed wiring board.

Conversely, as diagrammatically illustrated in FIG. 8, a ground plane layer 112 may be formed on the surface-mount attachment side 108 of printed wiring board 103. In this case, signal line attachment pads 113, having conductive vias 114 extending to transmission line tracks 115 on the opposite side 110 of the board, may be provided on the surface-mount attachment side 108 of the board.

Figure 9:
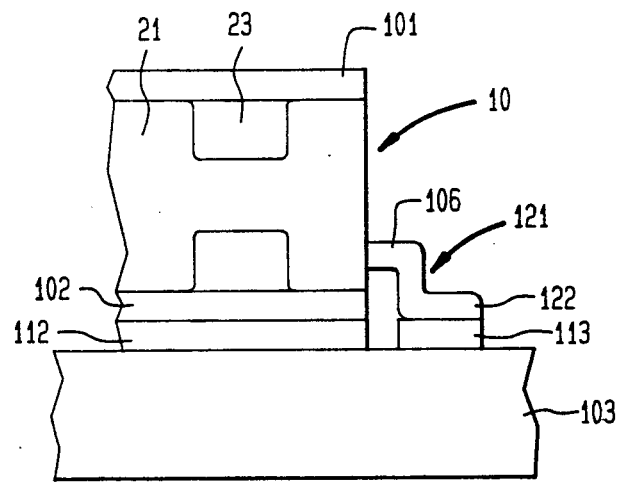
FIG. 9 diagrammatically shows a side view of a conductor projection that extends from a side edge of a waffleline module formed into a 'foot'.

To facilitate secure mechanical and electrical attachment of the signal conductor projections 106, which form the input and output ports of the module 10, to transmission line connection pads 113 on printed wiring board 103, a portion 121 of a stripped conductor projection 106 that extends from a side edge of the module may be formed into a 'foot' 122 by bending the conductor 106 downwardly and flattening the bent portion of the conductor, so that the foot 122 is coplanar with the bottom cover 102 of the module and thereby contiguous with the top of pad 113, as shown in FIG. 9. This flattened signal conductor 'foot' 122 may then be bonded (e.g. soldered using a tin-lead solder alloy) to a conductive bonding pad 113 on the top surface of printed wiring board. Advantageously, because of the considerable 'thinness' of the module, the length of signal conductor 'foot' 122 is typically relatively short (e.g. on the order of 8 mils), so that a very low inductance transition from the module to the signal pad on the printing wiring board is realized. In addition, the adjacent grounding tabs 112, through which the bottom cover 102 is attached to the printed wiring board, flank the signal 'foot' 122, thereby providing shielding and reducing the effective inductance of the signal conductor interconnect.

Figure 10:
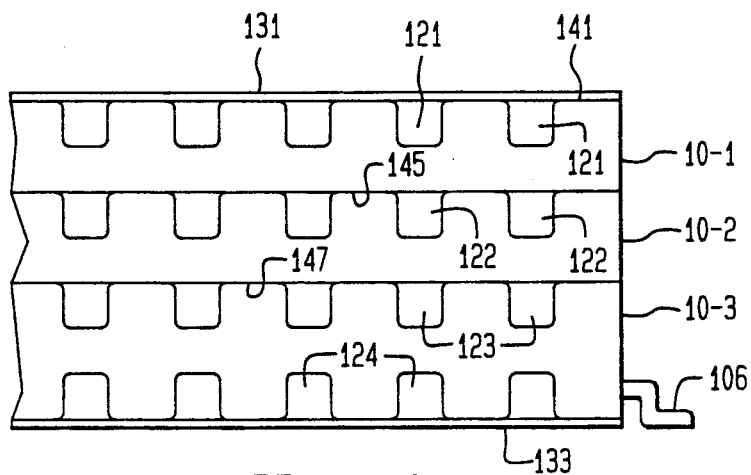
FIG. 10 diagrammatically illustrates multiple waffleline modules mounted in a stacked configuration on a printed wiring board to form a multilayer module structure.

As pointed out previously, because each waffleline-configured interconnect module is relatively thin (e.g. on the order of 30–40 mils), multiple modules may be mounted in a stacked configuration on the printed wiring board to form a multilayer module structure, as diagrammatically illustrated in FIG. 10 for the case of a three module laminate structure comprised of waffleline modules 10-1, 10-2 and 10-3. In accordance with this embodiment of the invention, the waffleline-configured module structure may contain one or more (e.g. two) single-sided waffleline plate layers 10-1, 10-2, and a dual-sided waffleline plate layer 10-3 stacked on top of one another. The number of such layers is dictated by the maximum thickness for any component permitted by the surface-mount design for the printed wiring board. For example, for the stacked configuration of FIG. 10, containing four waffleline channel layers 121–124, the total thickness of the module stack may be on the order of 145 mils. Respective top and bottom covers 131 and 133 are bonded to the tops of mesas 141 of single sided layer 10-1 and mesas 143 of dual sided layer 10-3. The continuous planar surface 145 of single-sided waffleline layer 10-1 forms a cover for channels 122 of single-sided waffleline layer 10-2. Similarly, the continuous planar surface 147 of single-sided waffleline layer 10-2 forms a cover for channels 123 of dual-sided waffleline layers 10-3.

Interconnections between the respective layers of the module are provided by way of vias, which may be located at the intersections of each channel, as described in the above-referenced Heckaman et al patent.

When such a four channel layer configuration has a square geometry, in plan, and an edge dimension of one inch, with the above-referenced 50 mil channel/mesa matrix periodicity, up to 80 inches of isolated (microwave) transmission line can be housed in a single module, thereby providing an extremely compact structure for extended signal line applications such as a tapped delay line.

The provision of through holes at each channel/channel intersection not only maximizes layer-to-layer interconnect flexibility (by forming a transmission line structure, the geometry of which is effectively periodic in three dimensions), but provides a practical benefit of reducing the weight of the module. Depending upon wire diameter there may be a slight spacing between the outer surface of the dielectric jacket and the mesa walls that define the channel in which the wire is placed, thereby increasing the characteristic impedance of that particular transmission line run. To compensate for this increase, the diameter of the through holes in the waffleline plate is sized to maintain the requisite impedance characteristic.

Figure 11:
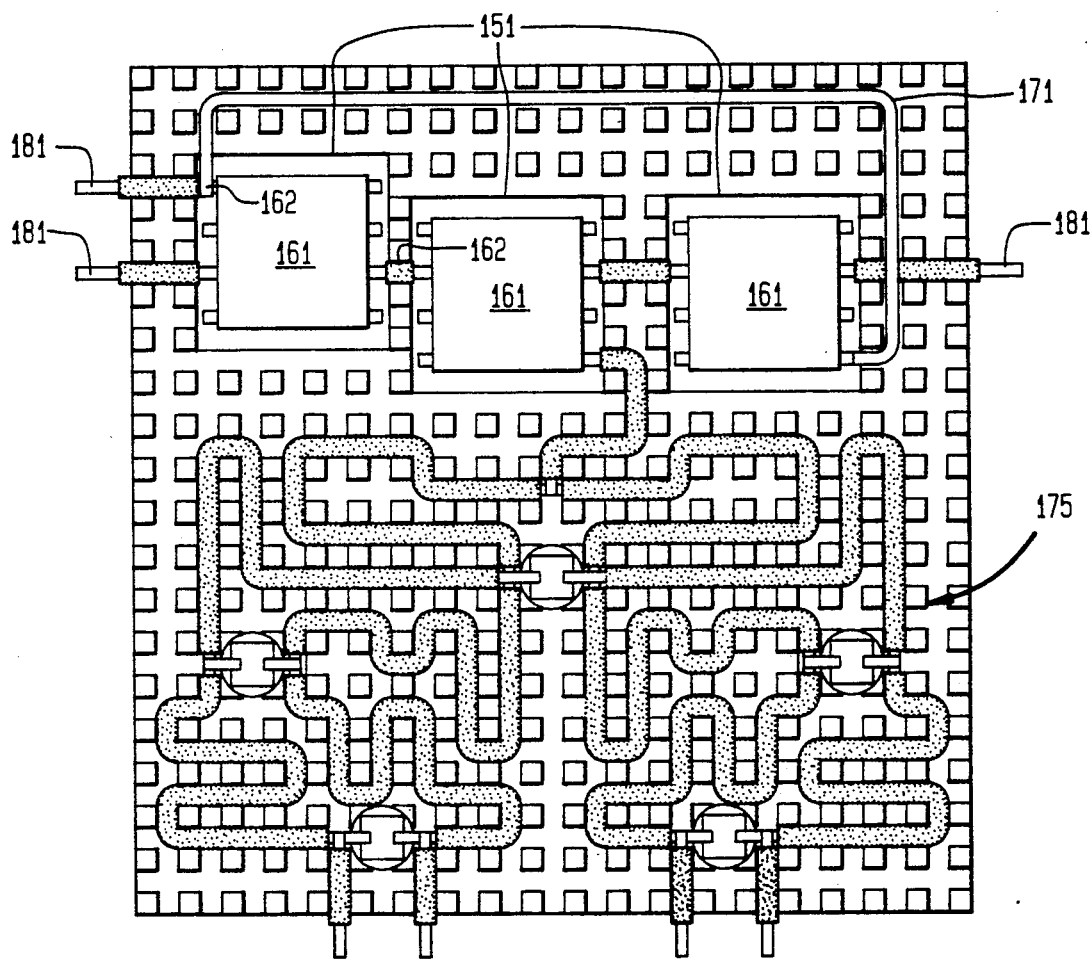
FIG. 11 shows a further embodiment of the present invention where one or more cavities are formed in a waffleline plate in order to accommodate respective circuit devices that are incorporated as part of the waffleline module.

FIG. 11 shows a further embodiment of the present invention where one or more cavities 151 (three in the illustrated embodiment) are formed (e.g. machined) in the waffleline plate in order to accommodate respective circuit devices 161 that are incorporated as part of the waffleline module. Respective signalling ports 162, of the circuit devices are interconnected via segment 171 of insulated conductor, to module input/output ports 181, and to a 1:4 power splitter 175, as shown.

In each of the above embodiments, the waffleline module is surface-mounted on the top surface of a printed wiring board, with signal conductor projections extending to transmission line pads and cover tabs being affixed to ground plane land regions on the surface of the board. However, because of its compact configuration, particularly that containing a laminate structure of plural waffleline plate layers, the present invention readily lends itself to cavity-mount architectures formed of one or more tiered layers of support board and interconnect.

Figure 12:
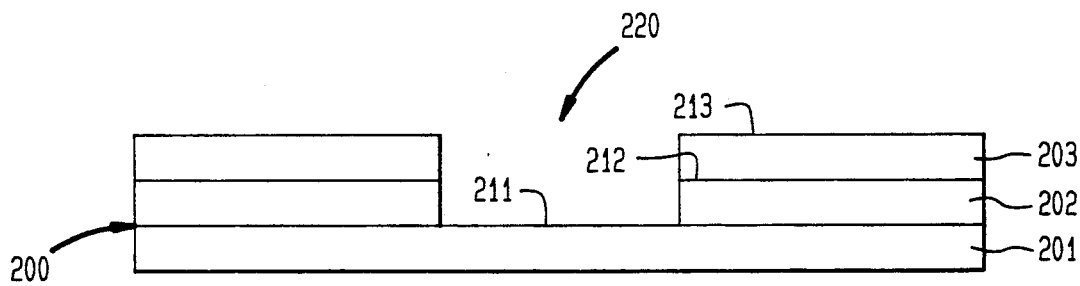
FIGS. 12 and 13 show an embodiment of multilayer signal processing device support structure containing a plurality of printed wiring board layers having respective stripline layers accessible by way of a cavity.
Figure 13:
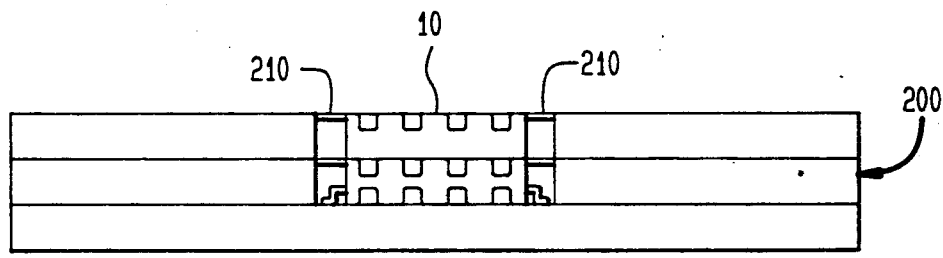

More particularly, FIGS. 12 and 13 show an embodiment of multilayer signal processing device support structure 200 that contains a plurality of (here three) printed wiring board layers 201, 202 and 203 having respective signal conductor (e.g. stripline) layers 211, 212 and 213 accessible by way of a cavity 220 that extends through wiring board layers 203 and 202. The multilayer waffleline surface-mount module of the above described embodiments of the present invention may be employed in such a cavity mount architecture to provide a transmission line device through which signals present on respective layers of the printed wiring board may be distributed to other printed wiring board layers. For this purpose, as shown in FIG. 13, the transmission line module 10 is inserted into the cavity 220 and input/output ports 210 of the module are connected to selected signal conductor layers of the support structure 200. A grounding shield layer, provided for example on the top printed wiring board 203 may be used as a bonding surface for tabs of a top cover of the waffleline module.

As will be appreciated from the foregoing description, the waffleline-configured transmission line packaging scheme according to the present invention allows high frequency signal coupling functions to be compactly integrated on the same surface-mount support structure as the signal processing components they interconnect, thereby not only enhancing package integrator density, but improving the signal processing performance of the overall communication circuitry architecture.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. For use with a printed wiring board upon which a plurality of signal processing components are mounted, a method of forming transmission line interconnect structures for interconnecting said signal processing components comprising the steps of:

a) providing a module of waffleline-configured conductive structure formed of a two-dimensional arrangement of periodically distributed conductive surface mesas, said mesas being spaced-apart from one another by a two-dimensional arrangement of channels therebetween;

b) disposing segments of dielectrically surrounded conductors within channels of said waffleline-configured conductive structure, so as to form, within said module, sections of transmission line, the characteristic impedance of which remains substantially constant regardless of changes in the direction a segment of conductor follows within the channels of said waffleline-configured conductive structure;

c) mounting, on said printed wiring board, one or more of the modules provided in step (a) and in which sections of transmission line have been disposed in step (b); and d) connecting respective portions of said segments of dielectrically surrounded conductor, disposed in channels of the one or more modules mounted in step (c), to signal ports of said signal processing components.

2. A method according to claim 1, wherein step (c) comprises stacking a plurality of modules together to form a multilayer module structure, providing interconnects between selected locations of segments of dielectrically surrounded conductor of adjacent modules, and mounting said multilayer module structure on said printed wiring board.

3. A method according to claim 1, further including the step of:

e) attaching a respective conductive cover to each of said modules, said cover being mounted on the tops of mesas, so that said segments of dielectrically surrounded conductor disposed in said channels are surrounded by the conductive material of said waffleline-configured conductive structure and the conductive cover thereon.

4. A method according to claim 3, wherein said conductive cover has a plurality of tabs that project from the sides of said module and step (c) comprises conductively adhering one or more of said tabs to metallized pads of said printed wiring board.

5. A method according to claim 1, wherein the module provided in step (a) has top and bottom conductive surfaces, each surface being in the form of a waffleline-configured conductive structure defined by a two-dimensional arrangement of periodically distributed conductive surface mesas, said mesas being spaced-apart from one another by a two-dimensional arrangement of channels therebetween.

6. A method according to claim 5, further including the step of:
   e) attaching a respective conductive cover to each of the top and bottom conductive surfaces of said module, said cover being mounted on the tops of mesas, so that said segments of dielectrically surrounded conductor disposed in said channels are surrounded by the conductive material of said waffleline-configured conductive structure and the conductive cover thereon.

7. A method according to claim 1, wherein step (a) comprises:
   a1) providing a first modular structure having top and bottom conductive surfaces, at least one surface thereof being in the form of a waffleline-configured conductive structure defined by a two-dimensional arrangement of periodically distributed conductive surface mesas, said mesas being spaced-apart from one another by a two-dimensional arrangement of channels therebetween,
   a2) providing a second modular structure having top and bottom conductive surfaces, at least one surface thereof being in the form of a waffleline-configured conductive structure defined by a two-dimensional arrangement of periodically distributed conductive surface mesas, said mesas being spaced-apart from one another by a two-dimensional arrangement of channels therebetween, and wherein step (C) comprises stacking said first and second modular structures together to form said module as a multilayer module structure such that said second modular structure is mounted against said first modular structure, providing interconnects between selected locations of segments of dielectrically surrounded conductor of said first and second modular structures, and mounting said multilayer module structure on said printed wiring board.

8. A method according to claim 7, further including the step of:
   e) attaching a respective conductive cover to each of said modular structures, said cover being mounted on the tops of mesas, so that said segments of dielectrically surrounded conductor disposed in said channels are surrounded by the conductive material of said waffleline-configured conductive structure and the conductive cover thereon.

9. A method according to claim 1, wherein step (d) comprises bending a portion of a conductor extending from a side edge of said module downwardly and flattening the bent portion of said conductor to form a foot, and conductively adhering said foot to a conductive bonding region of said printed wiring board.

10. A surface-mount device package containing a transmission line device having a plurality of signal coupling ports, said package being surface-mountable to a printed wiring board on which a plurality of signal processing components are supported, signal coupling ports of said package being connectable to selected ones of said plurality of signal processing components, comprising:
   a conductive module configured as a waffleline structure defined by a two-dimensional arrangement of periodically distributed conductive mesas, said mesas being spaced-apart from one another by a matrix of channels therebetween;
   segments of dielectrically surrounded conductor disposed within channels of said waffleline-configured conductive structure, so as to form, within said module, sections of transmission line, the characteristic impedance of which remains substantially constant regardless of changes in the direction a segment of dielectrically surrounded conductor follows within the channels of said waffleline-configured conductive structure;
   said module being mounted on said printed wiring board, with respective portions of said segments of dielectrically surrounded conductor disposed in channels of said module being connected to signal ports of said signal processing components.

11. A surface-mount device package according to claim 10, including plural modules stacked together as a multilayer module structure, with interconnects between selected locations of segments of dielectrically surrounded conductor of adjacent modules, said multilayer module structure being mounted on said printed wiring board.

12. A surface-mount device package according to claim 10, further including a conductive cover mounted on the tops of mesas, so that said segments of dielectrically surrounded conductor disposed in said channels are surrounded by the conductive material of said waffleline-configured conductive structure and the conductive cover thereon.

13. A surface-mount device package according to claim 12, wherein said conductive cover has a plurality of tabs that project from the sides of said module and wherein one or more of said tabs are attached to metallized pads of said printed wiring board.

14. A surface-mount device package according to claim 10, wherein said module has top and bottom conductive surfaces, each surface being in the form of a waffleline-configured conductive structure defined by a two-dimensional arrangement of periodically distributed conductive surface mesas, said mesas being spaced-apart from one another by a two-dimensional arrangement of channels therebetween.

15. A surface-mount device package according to claim 14, further including a respective conductive cover attached to the top and bottom conductive surfaces of said module, said covers being mounted on the tops of mesas, so that said segments of dielectrically surrounded conductor disposed in said channels are surrounded by the conductive material of said waffleline-configured conductive structure and the conductive covers thereon.

16. A surface-mount device package containing a transmission line device having a plurality of signal coupling ports, said package being surface-mountable to a printed wiring board on which a plurality of signal processing components are supported, signal coupling ports of said package being connectable to selected signal processing components, comprising:
   a first module having top and bottom conductive surfaces, each surface being in the form of a waffleline-configured conductive structure defined by a two-dimensional arrangement of periodically distributed conductive surface mesas, said mesas being spaced-apart from one another by a two-dimensional arrangement of channels therebetween;
   a second module having top and bottom conductive surfaces, one surface thereof being in the form of a waffleline-configured conductive structure defined by a two-dimensional arrangement of periodically distributed conductive surface mesas, said mesas being spaced-apart from one another by a two-dimensional arrangement of channels therebetween, another surface thereof being generally flat; and wherein said first and second modules are stacked together to form a multilayer module structure such that the generally flat surface of said second module is mounted against the mesas of one of the top and bottom surfaces of said first module, interconnects are provided between selected locations of segments of dielectrically surrounded conductor of said first and second modules, and said multilayer module structure is mounted on said printed wiring board.

17. A surface-mount device package according to claim 16, further including a respective conductive cover attached to each of said modules, said cover being mounted on the tops of mesas, so that said segments of dielectrically surrounded conductor disposed in said channels are surrounded by the conductive material of said waffleline-configured conductive structure and the conductive cover thereon.

18. A surface-mount device package according to claim 10, wherein a portion of a conductor extending from a side edge of said module is bent downwardly and flattened to form a foot, which is conductively bonded to a conductive bonding region of said printed wiring board.

19. For use with a surface-mount technology printed wiring board wherein a plurality of signal processing devices are surface-mounted to a printed wiring board, said signal processing devices being interconnected by sections of transmission line, a module for housing a passive transmission line device through which signals processed by a signal processing device may be distributed to other signal processing devices comprising:

a waffleline-configured plate at least one surface of which contains a matrix of conductively-surfaced mesas and channels distributed thereamong;

a plurality of segments of insulated conductors placed into the channels of said waffleline-configured plates in accordance with the signal coupling functionality of said passive transmission line device;

port-defining conductor segments extending through channels and projecting beyond said waffleline-configured plate so as to form input/output ports of said module; and a conductive cover formed atop mesas of said plate.

20. A module according to claim 19, wherein said conductive cover has a plurality of tabs extending beyond side edges of said waffleline-configured plate providing ground connections to conductive land regions of said printed wiring board.

21. A module according to claim 19, wherein said port-defining conductive segments having projecting portions which project beyond side edges of said waffleline-configured plate, said projecting portions being bent so as to form foot portions that coincide with signal pad regions of said printed wiring board.

22. A module according to claim 19, wherein said waffleline-configured plate has upper and lower surfaces, each of which contains a matrix of conductively-surfaced mesas and channels distributed thereamong, and a plurality of conductive wall vias interconnecting channels of said upper and lower surfaces, and wherein respective conductive covers are formed atop the mesas of said upper and lower surfaces of said plate.

23. A module according to claim 22, wherein segments of insulated conductor are placed into channels of each of said upper and lower surfaces of said waffleline-configured plate and wherein one or more of said segments extend through conductive wall through-holes so as to be placed in channels of upper and lower surfaces of said waffleline-configured plate.

24. For use with a surface-mount technology printed wiring board wherein a plurality of signal processing devices are surface-mounted to a printed wiring board, said signal processing devices being interconnected by sections of transmission line, a module for housing a passive transmission line device through which signals processed by a signal processing device may be distributed to other signal processing devices comprising:

a stacked arrangement of waffleline-configured plates, one or more of which has a first substantially continuous planar surface and a second surface containing a matrix of conductively-surfaced mesas and channels distributed thereamong;

a plurality of segments of insulated conductors placed into the channels of said waffleline-configured plates in accordance with the signal coupling functionality of said passive transmission line device;

port-defining conductor segments extending through channels and projecting beyond said waffleline-configured plate so as to form input/output ports of said module;

said stacked arrangement further including a dual waffleline-surfaced plate, upper and lower surfaces of which each contain a matrix of conductively surfaced mesas and channels distributed thereamong, and a plurality of conductive wall through holes interconnecting channels of its upper and lower surfaces; and conductive covers formed atop mesas of end plates of said stack.

25. For use with a multilayer signal processing device support structure having a plurality of signal conductor layers through which signal conductor layers are assessable, a method of forming a passive transmission line device through which signals present on respective conductive layers may be distributed to respective others of said signal conductor layers comprising the steps of:

(a) providing a cavity in said support structure so as to expose signal conductor layers of said plurality of signal conductor layers;

(b) providing a transmission line module by:

(b1) providing a module waffleline-configured conductive structure formed of a two-dimensional arrangement of periodically distributed conductive surface mesas, said mesas being spaced-apart from one another by a two-dimensional arrangement of channels therebetween, and (b2) disposing segments of dielectrically surrounded conductors within channels of said waffleline-configured conductive structure, so as to form, within said module, sections of transmission line, the characteristic impedance of which remains substantially constant regardless of changes in the direction a section of conductor follows within the channels of said waffleline-configured conductive structure, (d) interconnecting input/output ports of said module to selected signal conductor layers of said support structure.

26. For use with a multilayer signal processing device support structure having a plurality of signal conductor layers through which signal conductor layers are assessable, a method of forming a passive transmission line device through which signals present on respective conductor layers may be distributed to respective others of said signal conductor layers comprising the steps of:

(a) providing a cavity in said support structure so as to expose signal conductor layers of said plurality of signal conductor layers;

(b) providing a transmission line module comprising a stacked arrangement of waffleline-configured plates, one or more of which has a first substantially continuous planar surface and a second surface containing a matrix of conductively-surfaced mesas and channels distributed thereamong, a plurality of segments of insulated conductors placed into the channels of said waffleline-configured plates in accordance with the signal coupling functionality of said passive transmission line device, port-defining conductor segments extending through channels and projecting beyond said waffleline-configured plate so as to form input/output ports of said module, said stacked arrangement further including a dual waffleline-surfaced plate, upper and lower surfaces of which each contain a matrix of conductively surfaced mesas and channels distributed thereamong, and a plurality of conductive wall through holes interconnecting channels of its upper and lower surfaces, and conductive covers formed atop mesas of end plates of said stack;

(c) inserting said transmission line module in said cavity; and (d) interconnecting input/output ports of said module to selected signal conductor layers of said support structure.

* * * * *